(12) United States Patent
Rutter et al.

(10) Patent No.: US 9,268,351 B2
(45) Date of Patent: Feb. 23, 2016

(54) CASCODE SEMICONDUCTOR DEVICE FOR POWER FACTOR CORRECTION

(71) Applicant: NXP B.V., Eindhoven (NL)

(72) Inventors: Philip Rutter, Stockport (GB); Maarten Swanenberg, Berg en Dal (NL)

(73) Assignee: NXP B.V., Eindhoven (NL)

( * ) Notice: Subject to any disclaimer, the term of this patent is extended or adjusted under 35 U.S.C. 154(b) by 31 days.

(21) Appl. No.: 14/208,180

(22) Filed: Mar. 13, 2014

(65) Prior Publication Data

US 2014/0292287 A1      Oct. 2, 2014

(30) Foreign Application Priority Data

Mar. 28, 2013   (EP) ..................................... 13161707

(51) Int. Cl.
| | |
|---|---|
| *G05F 1/70* | (2006.01) |
| *H03K 17/0814* | (2006.01) |
| *H03K 17/567* | (2006.01) |
| *H01L 27/06* | (2006.01) |
| *H01L 27/088* | (2006.01) |
| *H03K 17/687* | (2006.01) |

(52) U.S. Cl.
CPC .............. *G05F 1/70* (2013.01); *H01L 27/0629* (2013.01); *H03K 17/08148* (2013.01); *H03K 17/567* (2013.01); *H01L 27/0605* (2013.01); *H01L 27/0883* (2013.01); *H03K 2017/6875* (2013.01)

(58) Field of Classification Search
CPC ................................. G05F 1/562; G05F 1/565
USPC ......... 323/205, 266, 304, 311–315, 317, 351; 327/328, 427, 430, 434
See application file for complete search history.

(56) References Cited

U.S. PATENT DOCUMENTS

| | | | |
|---|---|---|---|
| 5,073,723 A | 12/1991 | Da Costa | |
| 6,066,993 A | 5/2000 | Yamamoto et al. | |
| 6,218,904 B1 * | 4/2001 | Panther | H03F 1/0283 330/296 |
| 6,600,362 B1 * | 7/2003 | Gavrila | G05F 3/262 327/427 |
| 8,084,783 B2 | 12/2011 | Zhang | |
| 2009/0273323 A1 * | 11/2009 | Kimura | G05F 1/575 323/265 |
| 2010/0117095 A1 | 5/2010 | Zhang | |
| 2012/0262220 A1 | 10/2012 | Springett | |
| 2012/0268090 A1 | 10/2012 | Sasaki | |
| 2012/0299152 A1 | 11/2012 | Kemerer et al. | |
| 2014/0292395 A1 * | 10/2014 | Wu et al. | 327/434 |

FOREIGN PATENT DOCUMENTS

DE    10 2010 046 539 A1    3/2012

OTHER PUBLICATIONS

Extended European Search Report for EP Patent Appln. No. 13161707.8 (Jul. 23, 2013).

* cited by examiner

*Primary Examiner* — Adolf Berhane
*Assistant Examiner* — Nusrat Quddus

(57) ABSTRACT

A semiconductor device, comprising first and second field effect transistors arranged in a cascode configuration: wherein the first field effect transistor is a depletion mode transistor; and wherein the second field effect transistor comprises a first source to gate capacitance and a second additional source to gate capacitance connected in parallel to the first source to gate capacitance. A power factor correction (PFC) circuit comprising the semiconductor device. A power supply comprising the PFC circuit.

12 Claims, 4 Drawing Sheets

CASCODE SEMICONDUCTOR DEVICE FOR POWER FACTOR CORRECTION

CROSS-REFERENCE TO RELATED APPLICATIONS

This application claims the priority under 35 U.S.C. §119 of European patent application no. 13161707.8, filed on Mar. 28, 2013, the contents of which are incorporated by reference herein.

FIELD OF THE INVENTION

The invention relates to a semiconductor device and in particular to a transistor cascode arrangement. More particularly, the invention relates to said cascode arrangement comprising a Gallium Nitride based transistor device. The invention also relates to power factor correction circuits comprising such cascode arrangement and to power supplies comprising such power factor correction circuits

BACKGROUND OF THE INVENTION

In automotive electronics and high power RF technologies for example, devices such as III-V Gallium Nitride (GaN) High Electron Mobility Transistors (HEMTs) and SiC based Junction Gate Field-Effect Transistors (JFET) devices have enabled high voltage, high current and low on-resistance operation thereby resulting in high power and high efficiency operation. HEMTs and JFETs are examples of field effect transistor devices. The wide-band gap of GaN based devices offer robust and reliable devices capable of high voltage-high temperature operation. GaN technology is increasing in popularity due to better RF performance (lower capacitance and higher breakdown voltage) in comparison to silicon based devices used for example in power factor correction circuits used in power supplies for computing and portable communication devices.

GaN based field effect transistor devices are typically fabricated on silicon (Si), silicon carbide (SiC), and sapphire substrates. GaN HEMTs or SiC JFETs are typically depletion mode devices, therefore a negative gate voltage (when compared to the source voltage) and gate-drain biasing is required to switch the device. Such devices are therefore known as normally on devices. In other words when in use and without applying a gate source voltage the devices are in the on-state.

As a result of being normally on the input supply voltage is not isolated. Therefore at high voltages (for example 200-600 Volts) required for automotive and power supply applications, the inability to isolate the input voltage may increases the risk of damaging lower power ancillary circuits and components connected to such a high voltage device. Therefore driving a GaN HEMT or JFET device is a challenge for a number of reasons. Most notably a negative voltage bias is required to switch such normally on devices.

One technique for creating a normally off switch for such high voltage normally on devices is to use a cascode arrangement. In such an arrangement a low voltage FET 14 is placed in the source of the high voltage FET 10 device as illustrated in FIG. 1. When the low voltage FET is turned off, a negative gate voltage is created in the normally on high voltage device, thus turning off the high voltage device.

As shown in FIG. 1 the low voltage FET is an NMOS device. The NMOS low voltage FET is placed at the source of a high voltage device, where the drain of the low voltage FET is connected to the source of the high voltage device. The gate of the high voltage device and the source of the low voltage FET are connected such that they are the source terminal of the cascode device.

When the high voltage FET device is turned off, the drain-source voltage $V_{DS}$ of the low voltage FET (shown as Vx in FIG. 1) is determined by Eqn. 1, given below. Vx is a function of the threshold voltage of the high voltage device and the capacitance. In Eqn. 1 the capacitance $C_{OSS(MOS)}$ is equal to the sum of the gate-drain capacitance $C_{GD}$ and the drain source capacitance $C_{DS}$ of the low voltage FET device.

$$V_X = \frac{C_{DS(GaN)} \cdot V_d - (C_{OSS(MOS)} + C_{GS(GaN)}) \cdot V_{th(GaN)}}{C_{DS(GaN)} + (C_{OSS(MOS)} + C_{GS(GaN)})} \quad \text{Eqn. 1}$$

From Eqn. 1, Vx which is the drain source voltage $V_{DS}$ of the low voltage FET is dependent on the applied voltage rating $V_d$, which is limited by the maximum voltage rating of the high voltage FET device. Typically the maximum voltage rating of the high voltage FET device will be in the range of 60 to 100 Volts.

When the cascode device has been turned off, that is no gate voltage $V_g$ is applied to the low voltage FET, the drain source voltage Vx will change dependant on the respective reverse leakage currents of the high and low voltage FETs. The drain source leakage current $I_{DS(GaN)}$ of the high voltage FET will increase the drain source voltage Vx of the cascode device, whereas the drain source leakage current of the low voltage FET $I_{DS(nmos)}$ will reduce the drain source voltage Vx of the cascode device. Therefore the drain source voltage Vx of the low voltage FET will remain constant, decrease or increase and these situations can be expressed dependent on the leakage currents $I_{D(GaN)}$, $I_{DS(nmos)}$, and the gate leakage current of the high voltage FET $I_{G(GaN)}$.

Vx constant: $I_{DS(nmos)} - I_{G(GaN)} = I_{D(GaN)}$      1

Vx decrease: $I_{DS(nmos)} - I_{G(GaN)} > I_{D(GaN)}$      2

Vx increase: $I_{DS(nmos)} - I_{G(GaN)} < I_{D(GaN)}$      3

In each of the cases 1 to 3 above, since the source of the high voltage FET is at a higher potential than the gate the value of $I_{G(GaN)}$ will be negative.

For case 1, above, each of the leakage currents balance such that Vx remains constant. For case 2, above, Vx decreases to approximately the threshold voltage Vt of the high voltage FET, at which point $I_{D(GaN)}$ will increase until the leakage currents balance and Vx stabilises.

For case 3, above, Vx increases to the avalanche voltage of the low voltage FET, at which point $I_{DS(nmos)}$ will increase until the leakage currents balance and Vx stabilises. This case can cause the low voltage FET to avalanche.

Typically GaN based devices currently have a higher leakage currents when compared to Si based devices with the difference in leakages increasing the greater the difference in voltage rating. This means that the level of gate leakage in the GaN device is critical in determining whether case 3 occurs and the low voltage MOSFET is forced into avalanche.

Where the high voltage FET incorporates a Schottky gate, the majority of the drain leakage current will exit the high voltage FET via the gate. As such, the drain source leakage current of the high voltage device $I_{DS(GaN)}$ will be low, since the leakage current exits via the gate, little current will exit via the source hence $I_{DS(GaN)}$ will be low (and $I_{G(GaN)}$ will be high) and the situation given at case 2 above will occur. However, due to stability issues such as high frequency oscillations resulting from the high switching rate of GaN devices it may be necessary to include a series gate resistor at the gate of the high voltage FET to reduce the gate leakage current. If the gate resistance was high ($I_{G(GaN)}$ becomes low), case 3 could occur with Vx increasing to the avalanche voltage of the low voltage device.

Insulated gate GaN devices are preferred over Schottky gate devices due to the significantly lower gate leakage (due to the presence of the electrical isolation provided between the gate terminal and the GaN material), which when in use may result in reduced energy loss in the application. However, the avalanche situation of case 3 is more likely to occur in insulated gate devices due to the low leakage combined with the low. drain leakage current of the low voltage FET.

In some circumstances operating the low voltage device under avalanche conditions will result in increased device operating temperatures and this may not be problematic, for example where the device is not continuously operated or where sufficient heat sinking/packaging are provided. However, it is desirable for long term device reliability not to operate under avalanche conditions because hot carrier injection into the gate oxide of the low voltage MOSFET can result in increased Rds(on), threshold voltage Vt, reduction or increased drain source leakage and eventual device failure. Furthermore, if the avalanche voltage of the low voltage FET is greater than the maximum gate voltage of the high voltage FET then the high voltage FET could be damaged and failure could occur.

SUMMARY OF INVENTION

There is provided a semiconductor device, comprising first and second field effect transistors arranged in a cascode configuration: wherein the first field effect transistor is a depletion mode transistor having a leakage current in operation; wherein the second field effect transistor comprises a inherent drain to source resistance and additional drain to source resistance arranged in parallel to the first drain to source resistance, the second additional drain to source resistance arranged such that in operation current through the additional resistance is greater than the leakage current of the first field effect transistor.

The additional resistance ensure that the drain source voltage of the second field effect transistor does not increase when the cascode device is in the off state and effectively increases the leakage of the second field effect transistor.

The second additional drain to source resistance can be a resistive divider, which comprises at least two resistances connected as a voltage divider, wherein a common node of the voltage divider is connected to the gate of a third field effect transistor. This arrangement forms an active clamp and increases circuit design freedom, that is, it is not necessary to select resistor values (ohms) to ensure that the total leakage current of the low voltage FET will always be higher than the first field effect resistor and thus prevent additional power loss as discussed above.

There is also provided a power factor correction circuit comprising the semiconductor device, and a power supply comprising said power factor correction circuit.

DESCRIPTION OF THE DRAWINGS

The invention is described further hereinafter by way of example only with reference to the accompanying drawings in which.

Whilst the following discussion relates to MOSFETs, JFETs and HEMTs, the skilled person will recognise any suitable transistors may be used. The skilled person will also recognise that any device voltage rating may be used as dependent on the specific application requirements.

Figure 1:
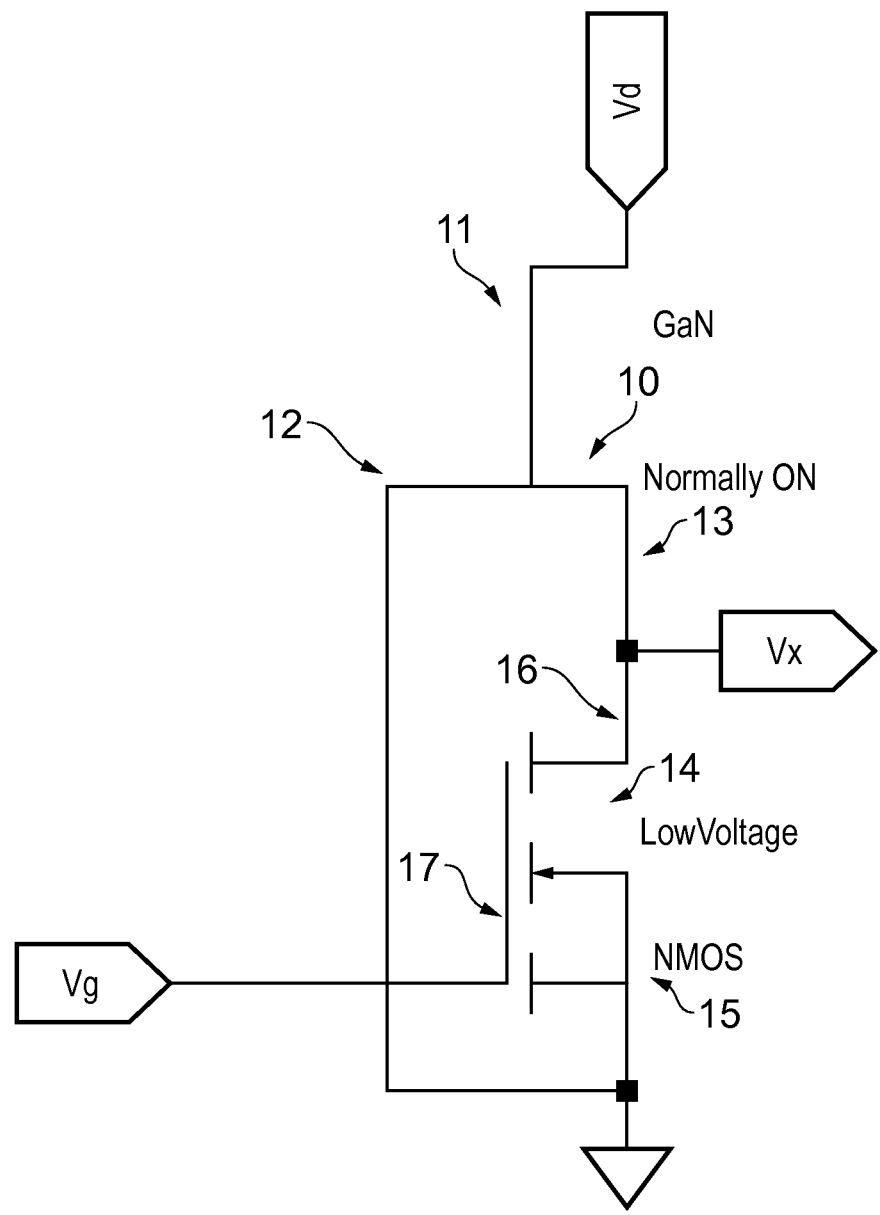
FIG. 1 is a circuit diagram of a cascode arrangement according to the prior art.

As illustrated in FIG. 1 a cascode arrangement includes a first field effect transistor such as high voltage FET device 10. The high voltage device 10 having source 13, gate 12 and drain 11 terminals. The cascode arrangement further includes a second field effect transistor such as for example a low voltage n-channel MOSFET 14. The low voltage MOSFET 14 and high voltage FET 10 devices are arranged as a three terminal cascode. The gate 12 of the high voltage FET 10 is connected to the source 15 of the low voltage MOSFET 14. The source 13 of the high voltage FET 10 is connected to the drain 16 of the low voltage MOSFET 14. The high voltage FET operates at a higher voltage than the low voltage FET. As understood in the art, high and low voltage devices are known as high side and low side devices.

The resulting cascode arrangement provides a three terminal device in which the drain 11 of the high voltage FET device 10 is the drain terminal and the gate 17 and source 15 of the low voltage MOSFET device 14 provide the gate and source terminals respectively.

Figure 2:
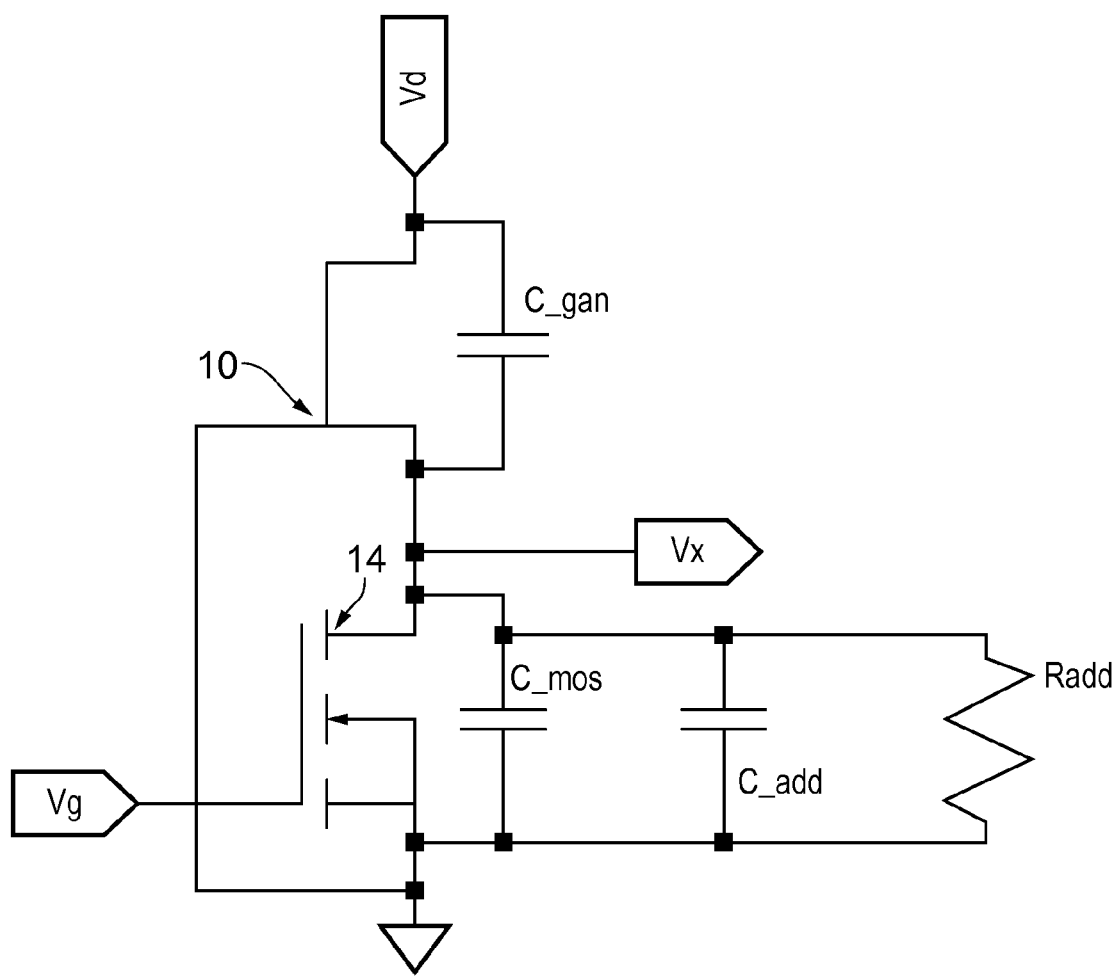
FIG. 2 is a circuit diagram of a cascode arrangement according to the present invention.

FIG. 2 (in which like reference numerals correspond to like features in FIG. 1) shows the cascode arrangement of FIG. 1 with some additional circuit detail. The high voltage FET device 10 may be a GaN HEMT or SiC JFET, with an inherent drain source capacitance $C\_{gan}$ which is the inherent junction capacitance of the high voltage device 10. The skilled person will appreciate however, that any suitable normally on device may be used. Likewise the low voltage MOSFET 14 may be an n-channel MOSFET and has an inherent drain source capacitance $C\_{mos}$ which is the inherent junction capacitance of the low voltage MOSFET 14. The skilled person will appreciate that any suitable low voltage MOSFET can be used.

An additional capacitance $C\_{add}$ may be provided across the drain and source of the low voltage MOSFET. The additional capacitance helps to prevent a high instantaneous voltages from occurring at Vx.

The low voltage MOSFET 14 includes an inherent drain source resistance (not illustrated). When the low voltage MOSFET 14 is in the on-state this resistance is known as Rds(on) and is the sum of the source material resistance, the channel resistance, the resistance of the epitaxial layer and the drain resistance. An additional resistance $R_{add}$ may be provided across the drain and source of the low voltage MOSFET 14, such that the additional resistance $R_{add}$ is in parallel to the low voltage MOSFET 14.

The additional resistance $R_{add}$ may be included by integrating a separate resistance into the overall cascode device die which contains the high voltage and low voltage MOSFETs. Alternatively, the high voltage and low voltage MOSFETs may be on separate dies, with the additional resistance $R_{add}$ integrated on the cheaper low voltage MOSFET 14 die. Alternatively the additional resistance $R_{add}$ may be a discrete resistance not integrated onto any die, but simply connected externally at circuit level across the drain and source connections of the low voltage MOSFET 14.

For the case where the additional resistance $R_{add}$ is integrated on the cheaper low voltage MOSFET 14 die a so-called poly-resistor can be formed in poly-silicon material of the die connected to the source and drain of the low voltage MOSFET. The poly-resistor maybe formed at the same time that the poly-silicon gate structure of the low voltage MOSFET is formed. It is also possible to use other layers such as SIPOS (semi-insulating poly-silicon) to form the additional resistance. Typically, for example the drain will be connected at the edge of the die. Because such a resistor crosses the edge termination structure, there is a risk that a voltage on this resistor could result in a parasitic channel compromising the capability of the edge termination. Methods of ensuring that this does not occur (for example by placing resistor above a thick insulating material) are well known in the art and for brevity are not described here.

Figure 3:
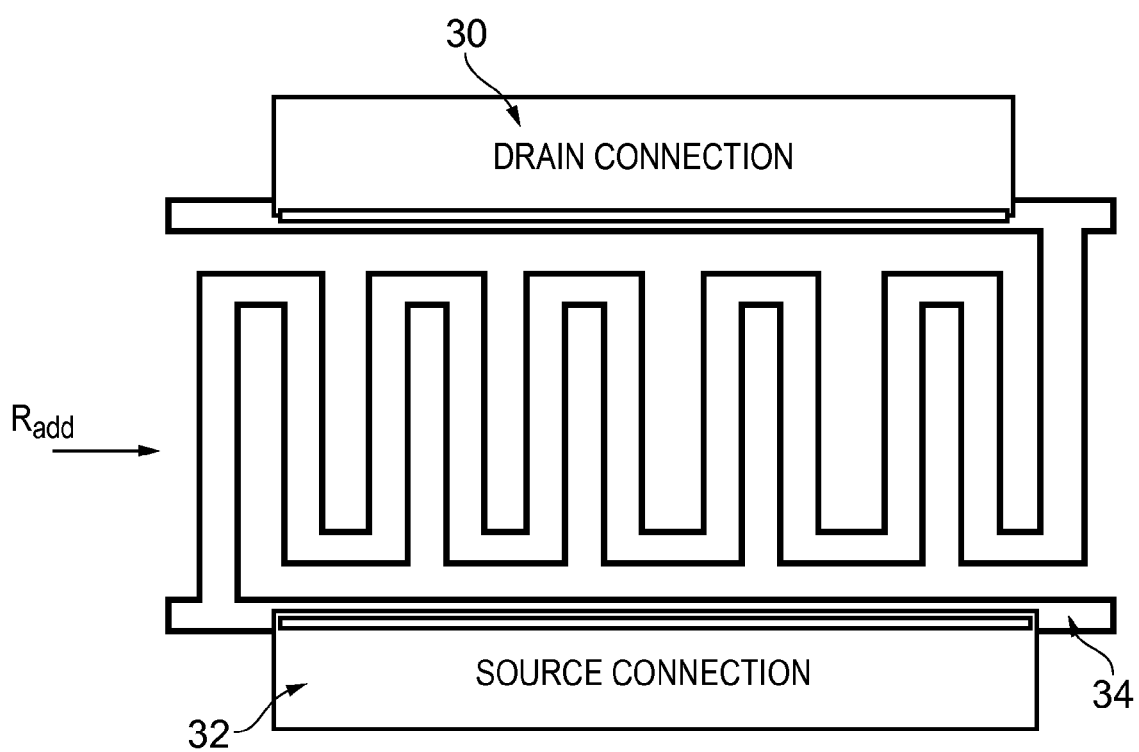
FIG. 3 is die layout of low voltage MOSFET device with additional resistance.

Alternatively, as illustrated in FIG. 3, a deep trench isolation structure, that is a vertical trench structure, may be used to form the additional resistance $R_{add}$ on the low voltage MOSFET die. Formation of deep trench isolations structures are well known in the art and for brevity will not be discussed here. As before the additional resistance $R_{add}$ is connected to the drain connection 30 and source connection 32 of the low voltage MOSFET. In this case the width of the poly-resistor is restricted to the width of the trench structure such that the required resistance takes up less die space, for example by using a snake or meander structure. Furthermore the use of such a structure ensures that edge terminations 34 are not compromised by the additional resistance $R_{add}$ crossing the edge termination as discussed above. Also, it is possible, with the addition of a p-body mask (not illustrated) to move the drain connection away from the edge termination allowing $R_{add}$ to be located on any part of the die. In FIG. 3 the vertical trench structure is connected to the source connection 32 effectively acts as an edge termination, that is, the active device area may be at the bottom of this structure.

The additional capacitance $C_{add}$ determines the value of the drain source voltage Vx (following from Equation 1 above). The value (ohms) of the additional resistance $R_{add}$ should be such that during operation the current through the additional resistor $R_{add}$ at the maximum allowed drain source voltage Vx will always be greater than the drain source leakage current $I_{DS}$ of the high voltage FET. Therefore the value of the additional resistance $R_{add}$ needs to be such to ensure Vx will always reduce. Vx will fall to a point where the high voltage FET 10 will turn on at a low current thereby ensuring that the current flowing through the high voltage FET 10 matches the current flowing through the additional resistance $R_{add}$ and case 1 above is achieved.

To prevent the voltage Vx rising and causing the low voltage MOSFET 14 to avalanche the sum of the current paths to ground should be greater than or equal to the drain current of the GaN device. If Vx divided by Radd is greater than Id(GaN) then avalanche will not occur. In terms of the three cases presented above, either case 2 or 3 will occur on turning off the device (the probability of all currents matching exactly is very low) so either Vx will decrease to the point that the high voltage FET 10 starts to conduct enough such that case 1 is met, or alternatively Vx will increase until the low voltage MOSFET 14 avalanches.

Figure 4:
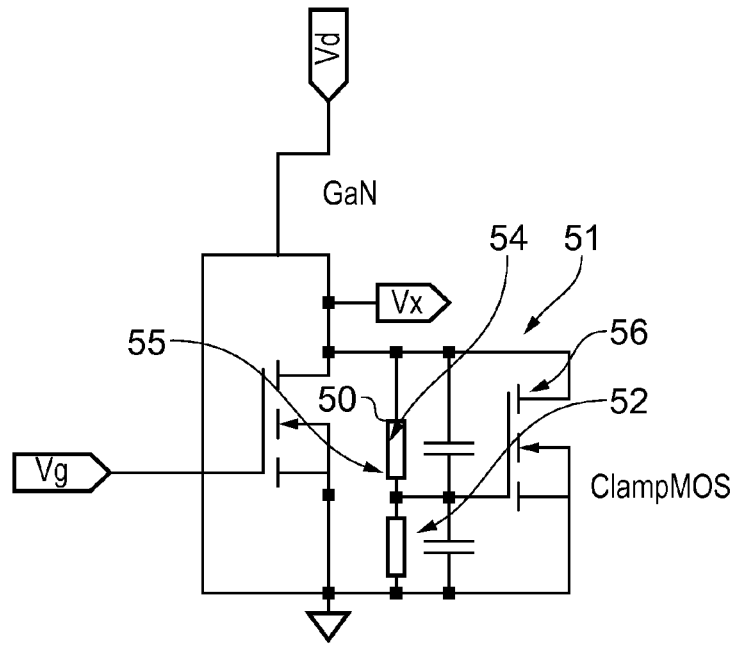
FIG. 4 is a circuit diagram of a clamp arrangement.

As illustrated in FIG. 4, the additional resistance $R_{add}$ can be arranged as clamp circuit 51. The clamp circuit 51 is formed of a resistive divider 50 placed between the drain and source of the low voltage MOSFET 14. The resistive divider 50 is formed of two resistances 52 and 54. The midpoint (or common node) 55 of the resistive divider 50 is connected to gate of a further low voltage MOSFET 56.

In operation, if the leakage current of the high voltage FET 10 causes Vx to rise, and correspondingly the voltage at the midpoint of the resistive divider also rises. The midpoint is the common node of the voltage divider. Since the midpoint is connected to the gate of the further low voltage MOSFET 56, which acts as a clamp device. Once the midpoint reaches the threshold voltage of MOSFET 56, it will start to turn on. When this happens, the excess current from the high voltage FET 10 no longer charges the capacitance of the low voltage MOSFET 14 but flows through the channel of further low voltage MOSFET 56. In this way case 1 above, is met. That is, the currents now balance due to the additional current of the further low voltage MOSFET 56 and Vx stabilises without causing an increase in the total leakage current.

The resistive divider 50 may be integrated using the deep trench isolation structures or by so-called poly-resistor as discussed above. Alternatively, the resistive divider 50 may be not integrated with the cascode device but provided externally to the device at circuit level.

Applications of the described arrangement can include Power Factor Correction (PFC) circuits used to isolate AC-DC mains converter supplies used for mobile computing and telecommunications devices. In such power supplies the AC input effectively sees a large inductive load, which can causes the power factor of the power supply to be less than one. PFC circuits allow the AC input see a near unity power factor. Near unity power factors are now required by state and national laws depending on the output power of the power supply.

A common PCF circuit is the active boost PFC, which ensures that the current drawn from the supply is sinusoidal (i.e. harmonic free) and in phase with the current. This arrangement is illustrated in FIG. 5.

Figure 5:
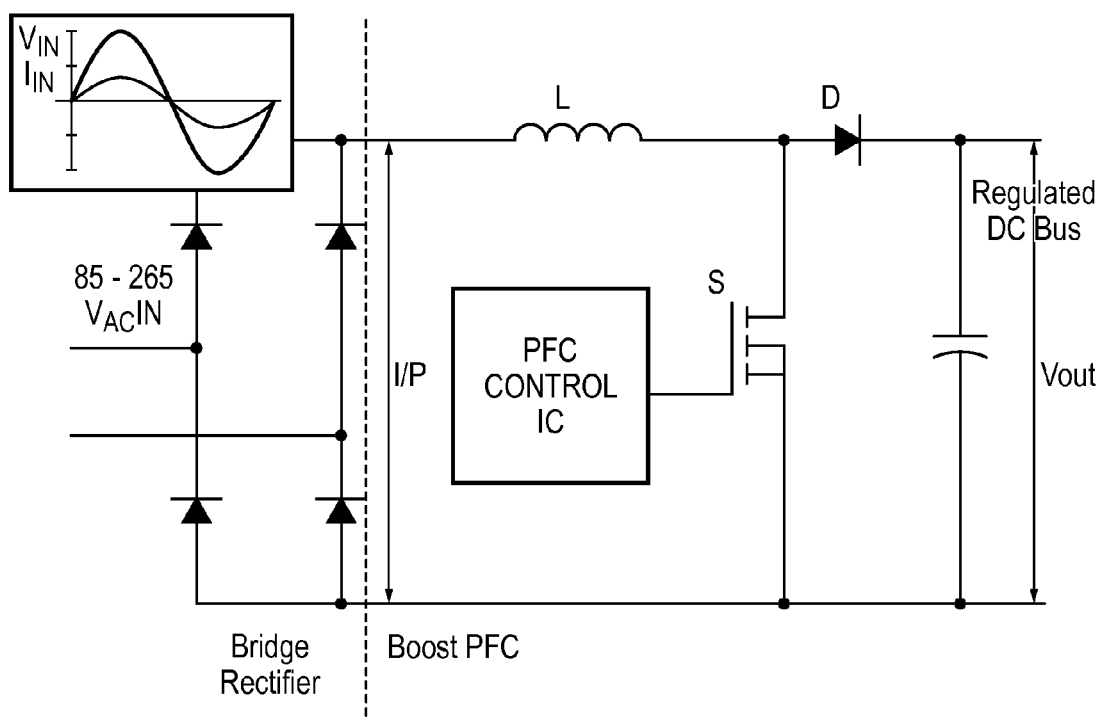
FIG. 5 is a circuit diagram of a power factor correction circuit.

As shown in FIG. 5, the input UP to the PFC circuit is a rectified AC mains voltage and the output is a rectified DC voltage. Rectification of the AC mains is achieved by way of the illustrated diode bridge circuit. The boost circuit itself consists of an inductor L, high voltage powers switch S, and high voltage PFC diode D. The duty cycle of the high voltage switch S is controlled in a manner to regulate that output voltage $V_{out}$; ensuring a close to unity power factor, and to minimize harmonic current distortion. The PFC diode D can be a high voltage component and in high efficiency PFC circuits it can be fabricated in SiC or GaN due to the superior reverse recovery characteristics of these devices over silicon devices. In particular, it is possible to fabricate both the high voltage switch S and diode on the same die in a GaN HEMT process.

In this particular circuit, the high voltage input is connected to the drain of the high voltage switch S via an inductor with the source of the high voltage switch S connected to ground. It then follows that when not operating (that is no power applied to the switch), the high voltage switch must be turned off to prevent shorting of the input voltage to ground. Due to this requirement, a normally on device needs to be used in a cascode arrangement to convert it to a normally off device. To this end the cascode arrangement discussed above is suitable as a high voltage switch S to use in this PFC arrangement.

The cascode device, used in such a PFC application could also integrate the PFC diode into the same package. The cascode S and diode manufacturing processes may be compatible, such as in a GaN HEMT process, then these two components may be integrated onto a single die. Alternatively, the diode D may be integrated with either the low voltage MOSFET 14 or high voltage FET 10 devices.

The described arrangements can also be used to monolithically integrate power devices with control integrated circuits for example in compact fluorescent lighting (CFL) applications.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims

The invention claimed is:

1. A semiconductor device, comprising first and second field effect transistors arranged in a cascode configuration:
   wherein the first field effect transistor is a depletion mode transistor having a leakage current in operation;
   wherein the second field effect transistor comprises an inherent drain to source resistance and additional drain to source resistance arranged in parallel to the first drain to source resistance, the second additional drain to source resistance arranged such that in operation current through the additional resistance matches the leakage current of the first field effect transistor; and
   whereby a gate of the first field effect transistor is connected to the drain of the second field effect transistor; and
   wherein the second additional drain to source resistance is a resistive divider, and comprises at least two resistances connected as a voltage divider having a common node, wherein the common node of the voltage divider is connected to the gate of a third field effect transistor.

2. The semiconductor device of claim 1, wherein the leakage current is a drain source leakage current.

3. The semiconductor device of claim 1, wherein the second additional drain source resistance is an active clamp.

4. The semiconductor device of claim 1, wherein the second additional drain to source resistance is integrated with the second field effect transistor.

5. The semiconductor device of claim 1, wherein the first field effect transistor is a High Electron Mobility Transistor or a Junction Gate Field Effect Transistor.

6. The semiconductor device of claim 1, wherein the second and third field effect transistors are n-channel transistors.

7. The semiconductor device of claim 1, wherein the first, second and third field effect transistors are integrated onto a single die.

8. A power factor correction circuit comprising the semiconductor device as claimed in claim 1.

9. A power supply comprising the power factor correction circuit of claim 8.

10. A semiconductor device, comprising first and second field effect transistors arranged in a cascode configuration:
    wherein the first field effect transistor is a depletion mode transistor having a leakage current in operation;
    wherein the second field effect transistor comprises an inherent drain to source resistance and additional drain to source resistance arranged in parallel to the first drain to source resistance, the second additional drain to source resistance arranged such that in operation current through the additional resistance matches the leakage current of the first field effect transistor; and
    whereby a gate of the first field effect transistor is connected to the drain of the second field effect transistor; and
    wherein the second additional drain to source resistance is integrated by deep trench isolation.

11. A semiconductor device, comprising first and second field effect transistors arranged in a cascode configuration:
    wherein the first field effect transistor is a depletion mode transistor having a leakage current in operation;
    wherein the second field effect transistor comprises an inherent drain to source resistance and additional drain to source resistance arranged in parallel to the first drain to source resistance, the second additional drain to source resistance arranged such that in operation current through the additional resistance matches the leakage current of the first field effect transistor;
    whereby a gate of the first field effect transistor is connected to the drain of the second field effect transistor; and
    wherein an additional capacitance arranged in parallel across drain and source of the second field effect transistor.

12. The semiconductor device of claim 11, wherein the additional capacitance is arranged to increase the junction capacitance of the second field effect transistor.

* * * * *